(12) United States Patent
Chen et al.

(10) Patent No.: US 10,772,232 B2
(45) Date of Patent: *Sep. 8, 2020

(54) BRACKET DEVICE

(71) Applicants: KING SLIDE WORKS CO., LTD., Kaohsiung (TW); KING SLIDE TECHNOLOGY CO., LTD., Kaohsiung (TW)

(72) Inventors: Ken-Ching Chen, Kaohsiung (TW); Shun-Ho Yang, Kaohsiung (TW); Kai-Wen You, Kaohsiung (TW); Chun-Chiang Wang, Kaohsiung (TW)

(73) Assignees: KING SLIDE WORKS CO., LTD., Kaohsiung (TW); KING SLIDE TECHNOLOGY CO., LTD., Kaohsiung (TW)

( * ) Notice: Subject to any disclaimer, the term of this patent is extended or adjusted under 35 U.S.C. 154(b) by 0 days.

This patent is subject to a terminal disclaimer.

(21) Appl. No.: 16/359,993

(22) Filed: Mar. 20, 2019

(65) Prior Publication Data

US 2019/0223313 A1    Jul. 18, 2019

Related U.S. Application Data

(63) Continuation of application No. 14/955,055, filed on Dec. 1, 2015, now Pat. No. 10,292,297.

(30) Foreign Application Priority Data

Sep. 18, 2015 (TW) .............................. 104131078 A

(51) Int. Cl.
*H05K 7/14* (2006.01)
*A47B 88/423* (2017.01)

(52) U.S. Cl.
CPC ......... *H05K 7/1489* (2013.01); *A47B 88/423* (2017.01)

(58) Field of Classification Search
CPC ..... A47B 88/423; A47B 96/07; A47B 96/067; H05K 7/1489
See application file for complete search history.

(56) References Cited

U.S. PATENT DOCUMENTS 6,655,534 B2    12/2003   Williams
7,192,103 B2    3/2007    Hamilton
(Continued)

FOREIGN PATENT DOCUMENTS

CN        102695396           9/2012
DE    20 2004 018 376 U1      2/2005
(Continued)

*Primary Examiner* — Kimberly T Wood
(74) *Attorney, Agent, or Firm* — Winston Hsu

(57) ABSTRACT

A bracket device is configured to mount a slide rail to a post. The bracket device includes a bracket, a hook, a locking element and an extension element. The bracket has a first engagement part. The hook is connected to the bracket and located at a close position relative to the bracket. The locking element is operatively engaged with the first engagement part of the bracket for abutting against the hook to hold the hook at the close position. The extension element is connected to the locking element. Wherein, when the locking element is operatively disengaged from the bracket, the locking element no longer abuts against the hook, and the hook is no longer held at the close position relative to the bracket.

14 Claims, 15 Drawing Sheets

(56) References Cited

U.S. PATENT DOCUMENTS

| | | |
|---|---|---|
| 7,281,694 B2 | 10/2007 | Allen |
| 7,357,362 B2 | 4/2008 | Yang |
| 8,079,654 B2 | 12/2011 | Yu |
| 8,146,756 B2 | 4/2012 | Brock |
| 8,353,494 B2 | 1/2013 | Peng |
| 8,727,138 B2 | 5/2014 | Dittus |
| 8,770,528 B2 | 7/2014 | Chen |
| 8,967,565 B2 | 3/2015 | Chen |
| 9,125,489 B2 | 9/2015 | Chen |
| 9,328,769 B1 | 5/2016 | Chen |
| 9,402,475 B2 | 8/2016 | Gu |
| 9,480,183 B2 | 10/2016 | Chen |
| 10,292,297 B2 * | 5/2019 | Chen .............. H05K 7/1489 |
| 2001/0040142 A1 | 11/2001 | Haney |
| 2005/0156493 A1 | 7/2005 | Yang |
| 2009/0166485 A1 | 7/2009 | Chen |
| 2009/0283652 A1 | 11/2009 | Chen |
| 2009/0309471 A1 | 12/2009 | Yu |
| 2010/0327135 A1 | 12/2010 | Selvidge |
| 2011/0290746 A1 | 12/2011 | Lu |
| 2012/0145850 A1 | 6/2012 | Yu |
| 2012/0193489 A1 | 8/2012 | Yu |
| 2012/0292928 A1 | 11/2012 | Chang |
| 2014/0070064 A1 | 3/2014 | Chen |
| 2014/0363108 A1 | 12/2014 | Chen |
| 2015/0069196 A1 | 3/2015 | Chen |
| 2015/0173510 A1 | 6/2015 | Yu |
| 2015/0201754 A1 | 7/2015 | Chen |
| 2015/0335156 A1 | 11/2015 | Chen |
| 2016/0097229 A1 | 4/2016 | Chen |

FOREIGN PATENT DOCUMENTS

| | | |
|---|---|---|
| EP | 2 979 582 A1 | 2/2016 |
| JP | 08148860 A * | 6/1996 |
| JP | H08-148860 A | 6/1996 |
| JP | 3187606 U | 12/2013 |
| JP | 3197165 U | 4/2015 |

* cited by examiner

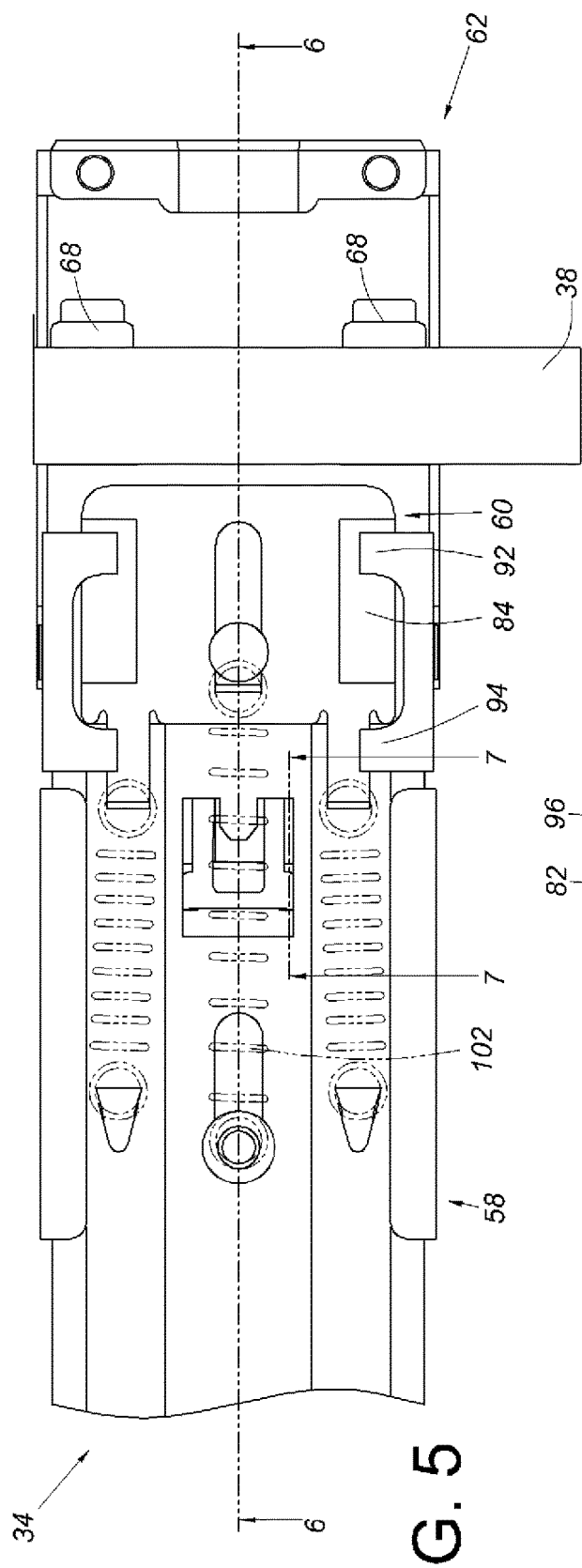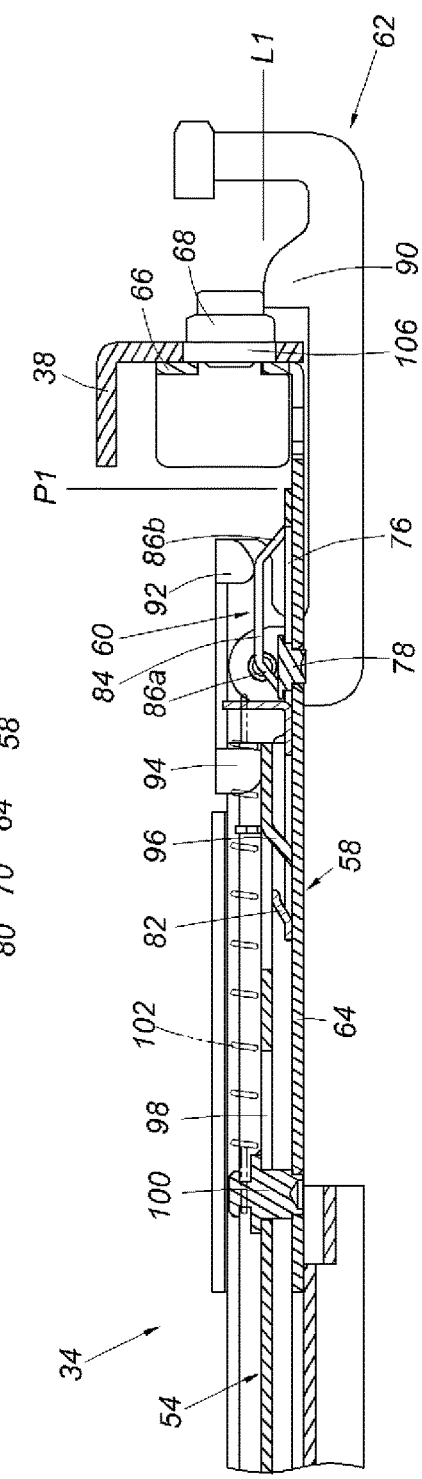

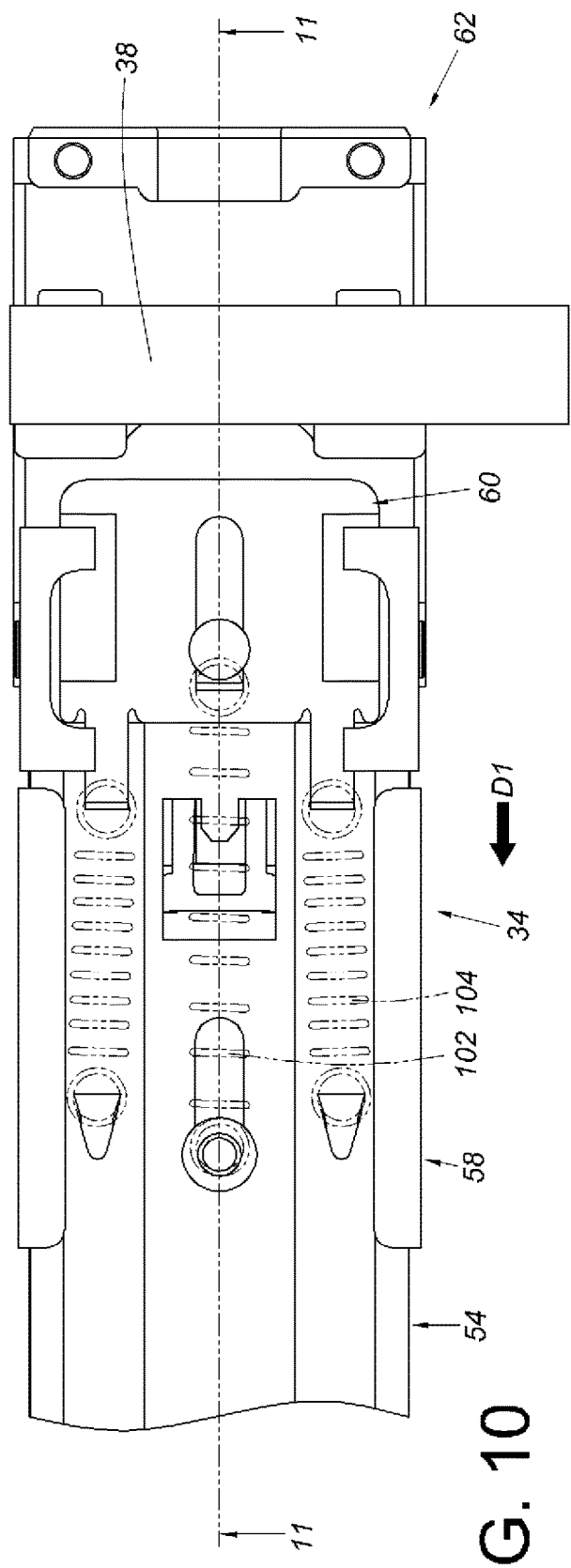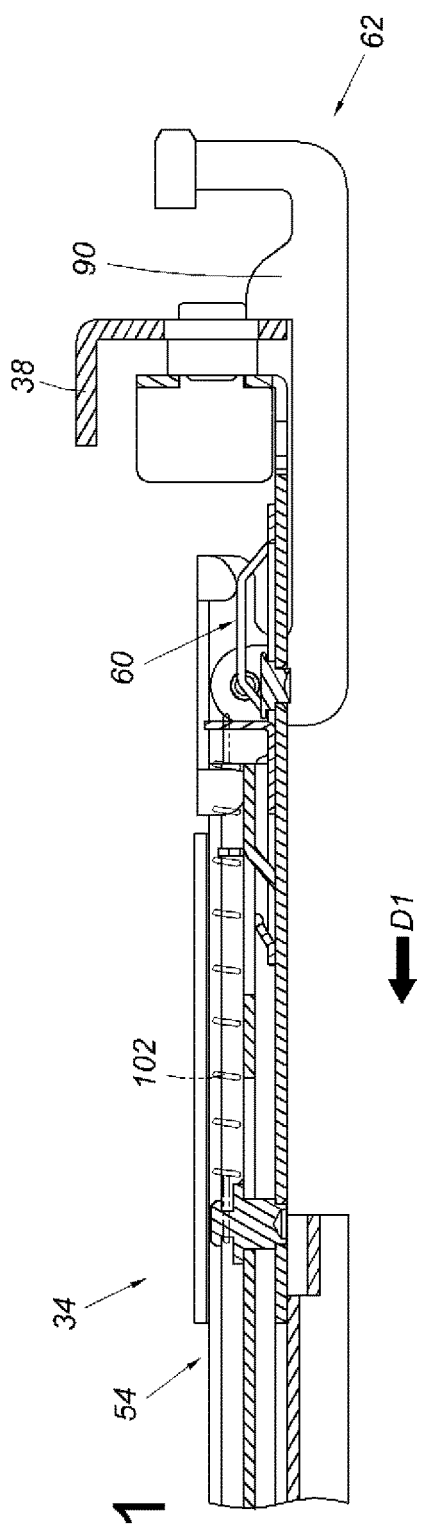
FIG. 10
FIG. 11

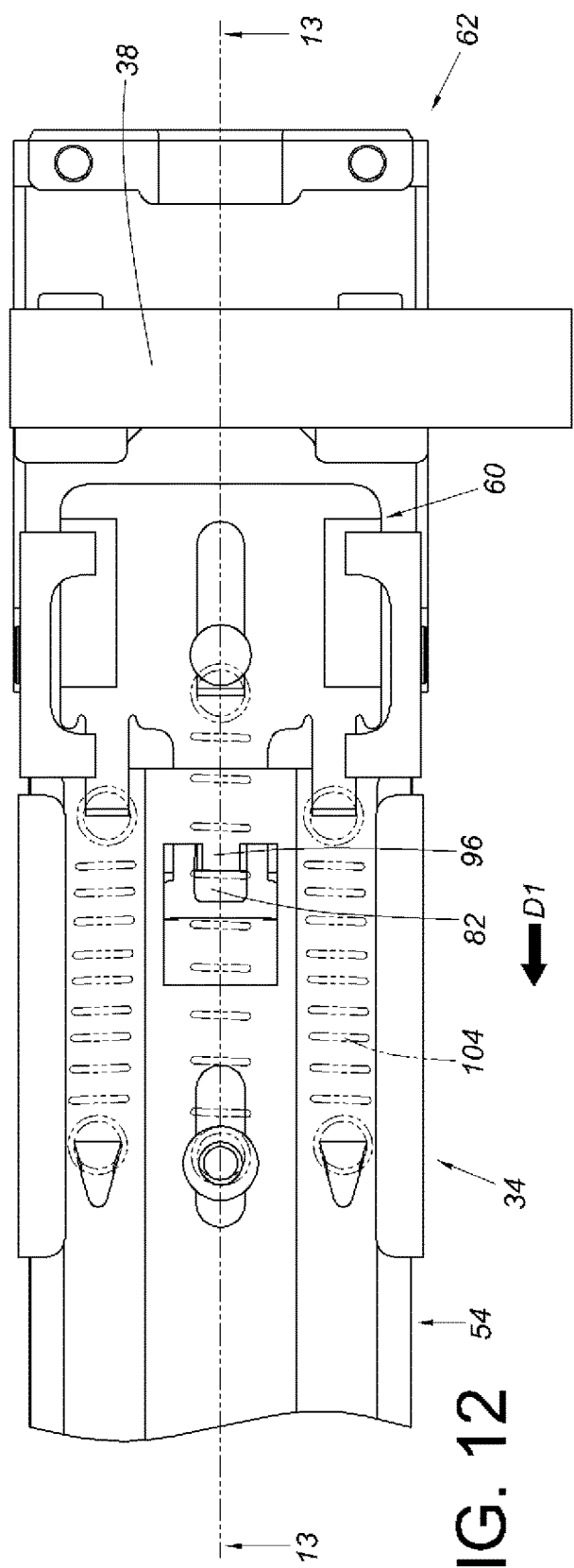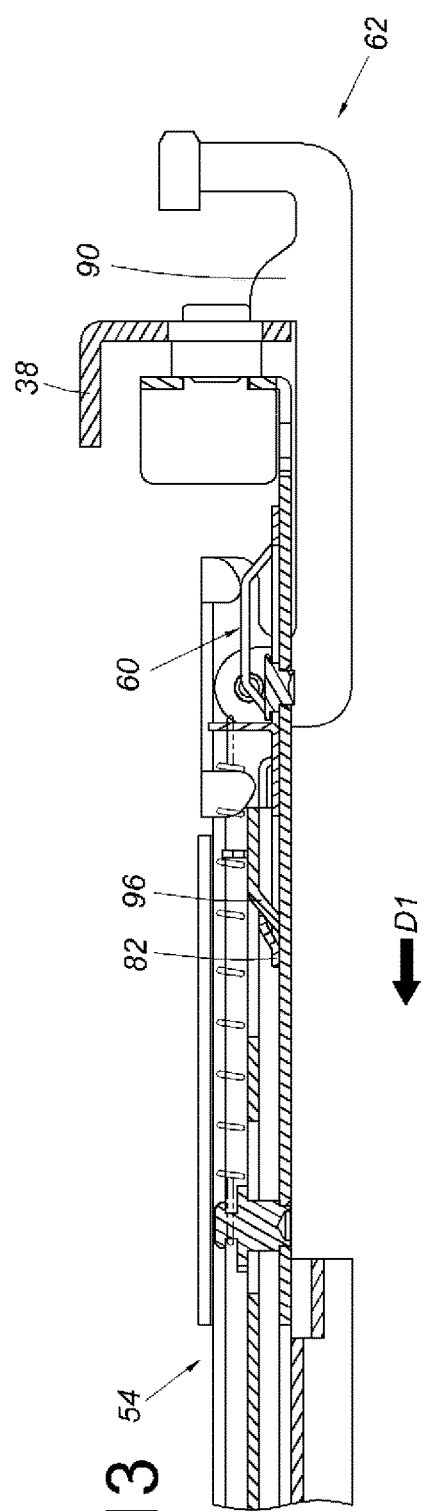

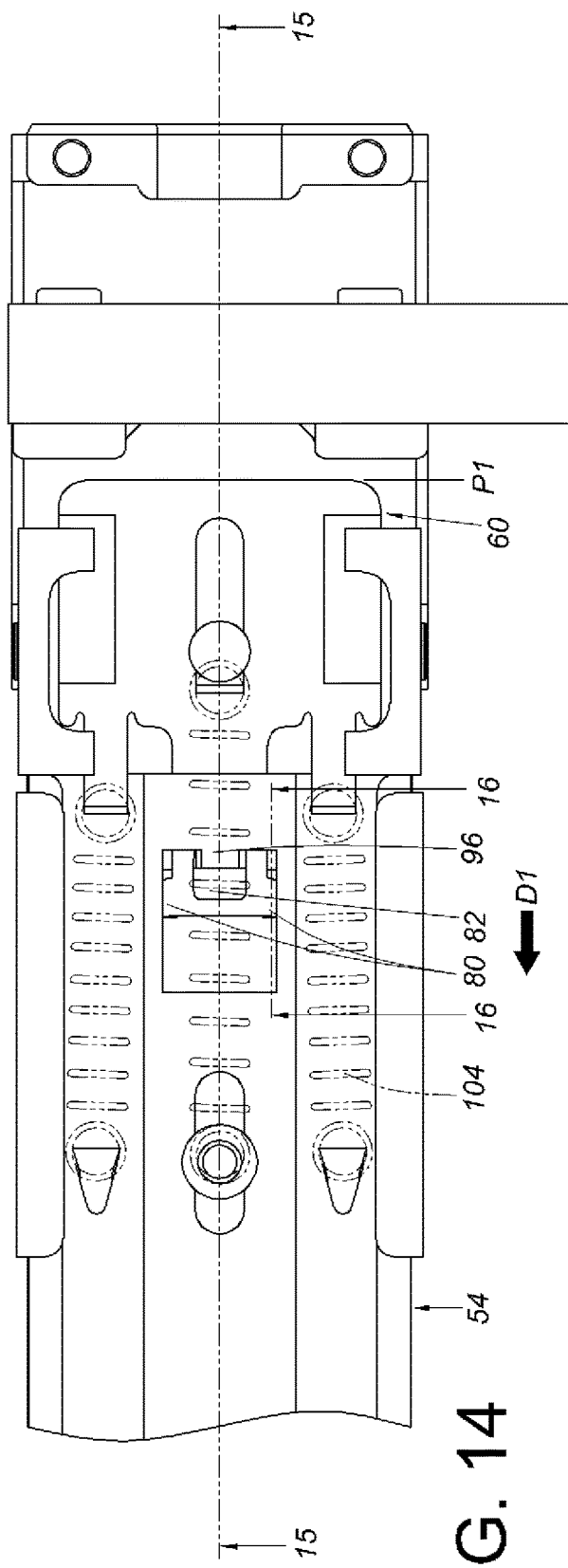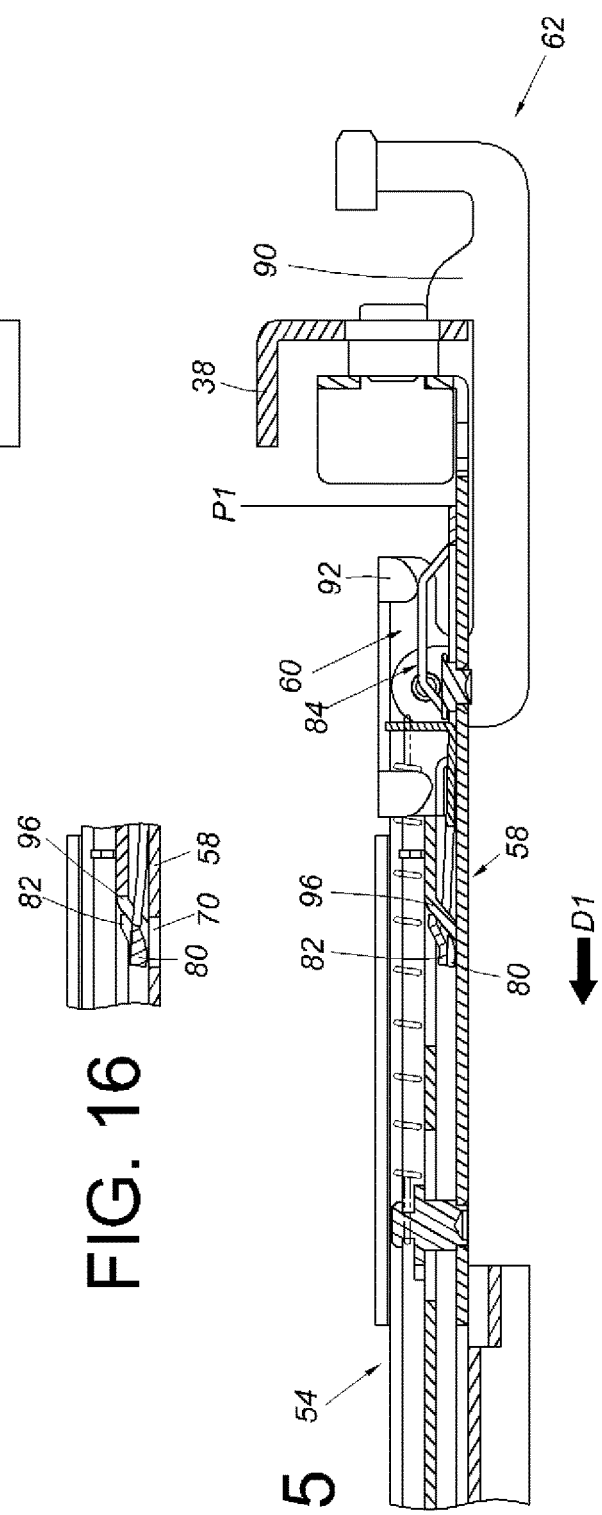

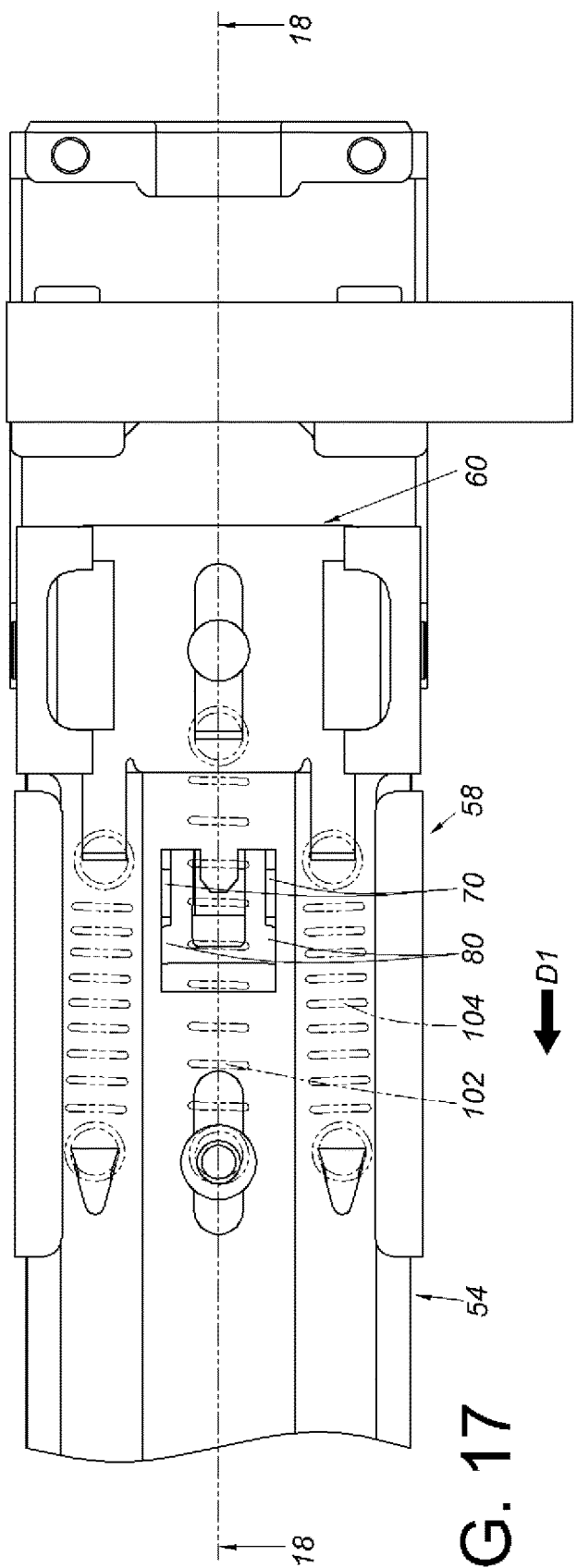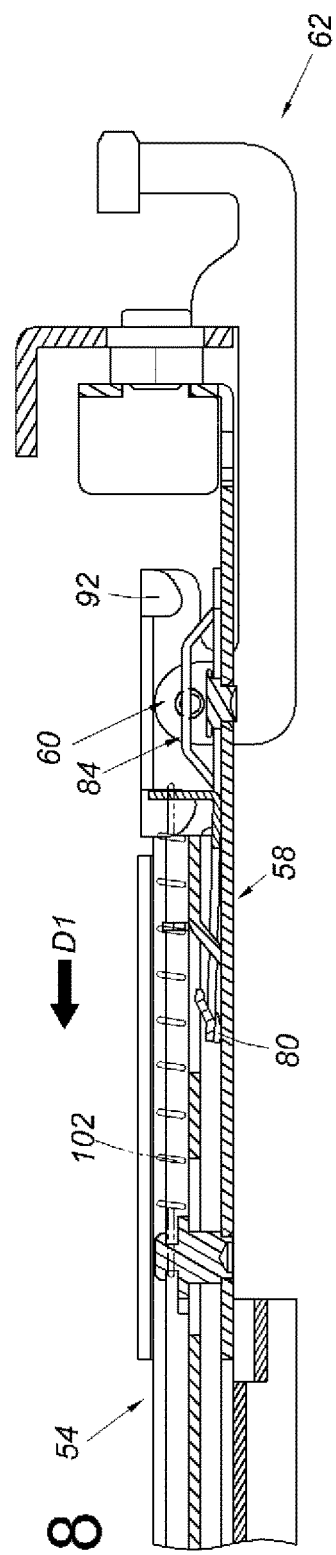
FIG. 17
FIG. 18

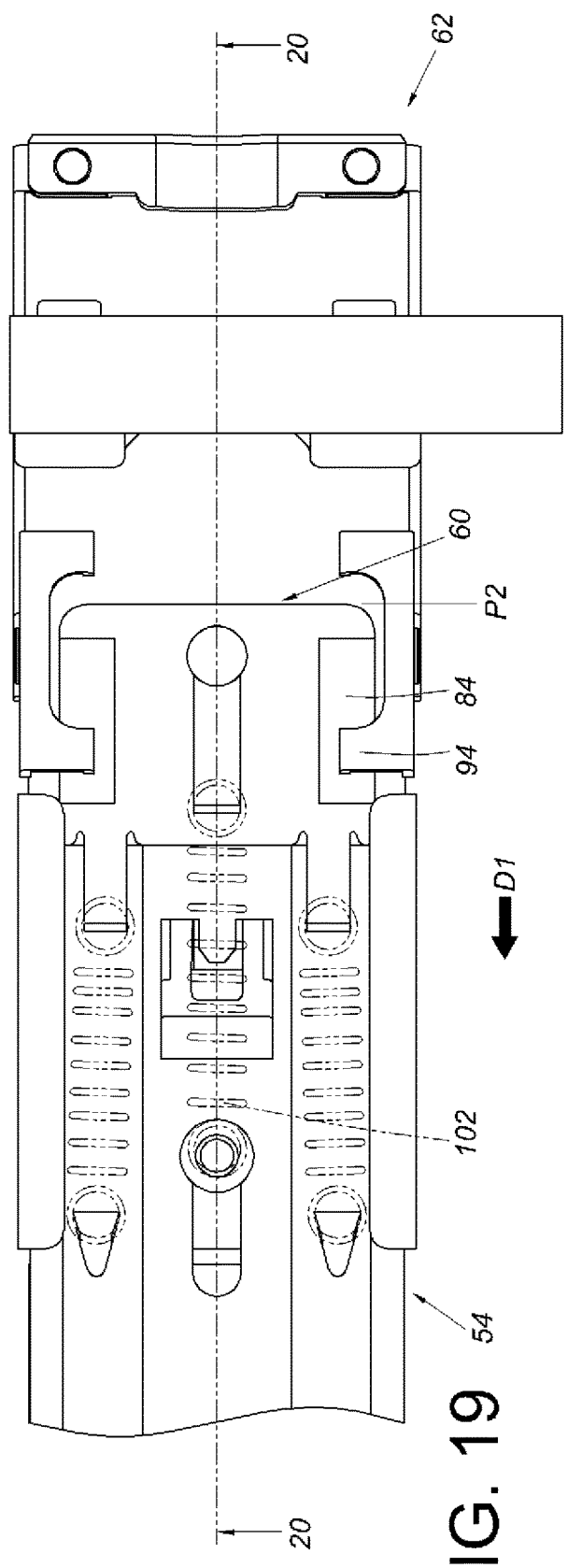
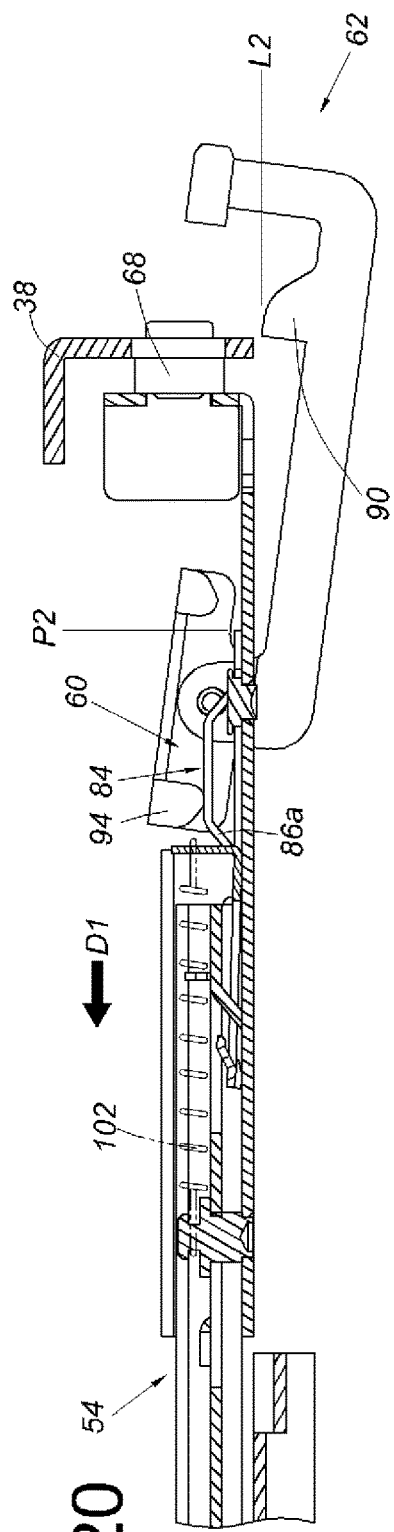
FIG. 19
FIG. 20

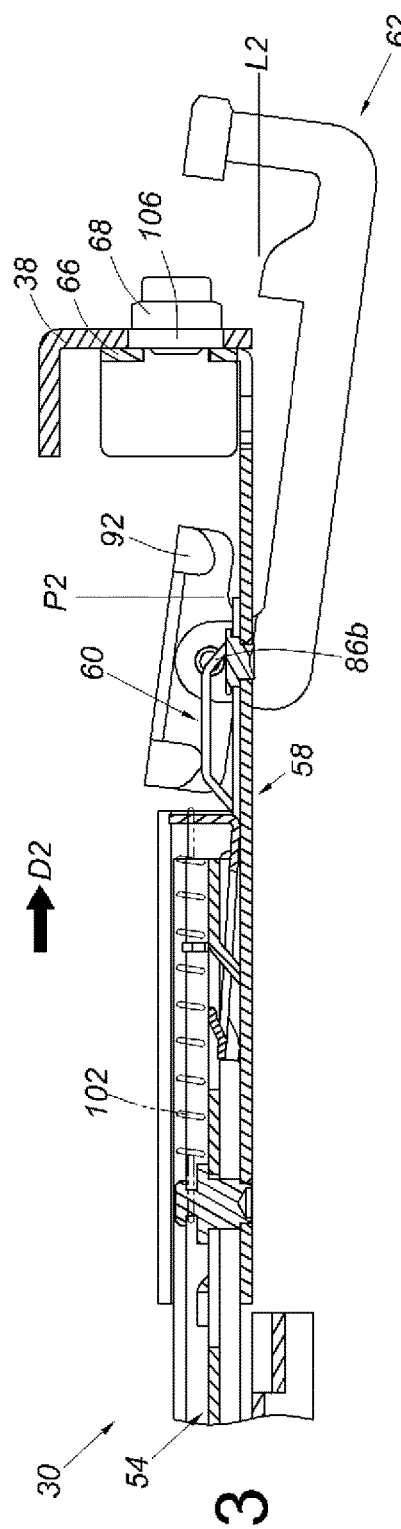
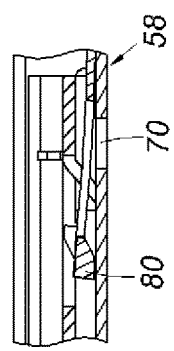
FIG. 23
FIG. 24
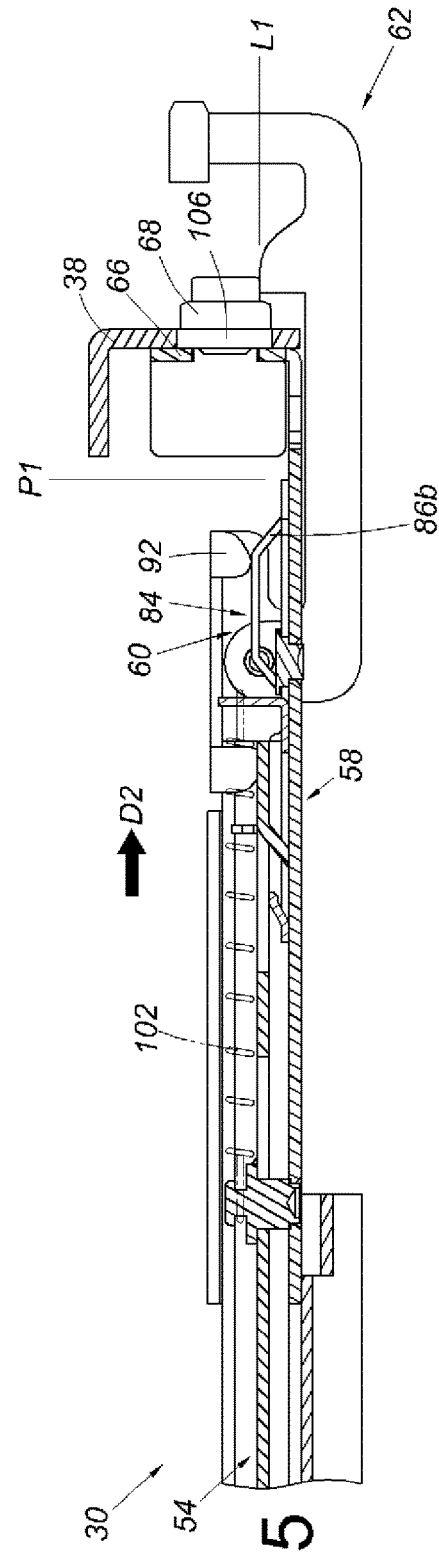
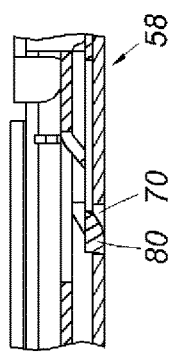
FIG. 25
FIG. 26

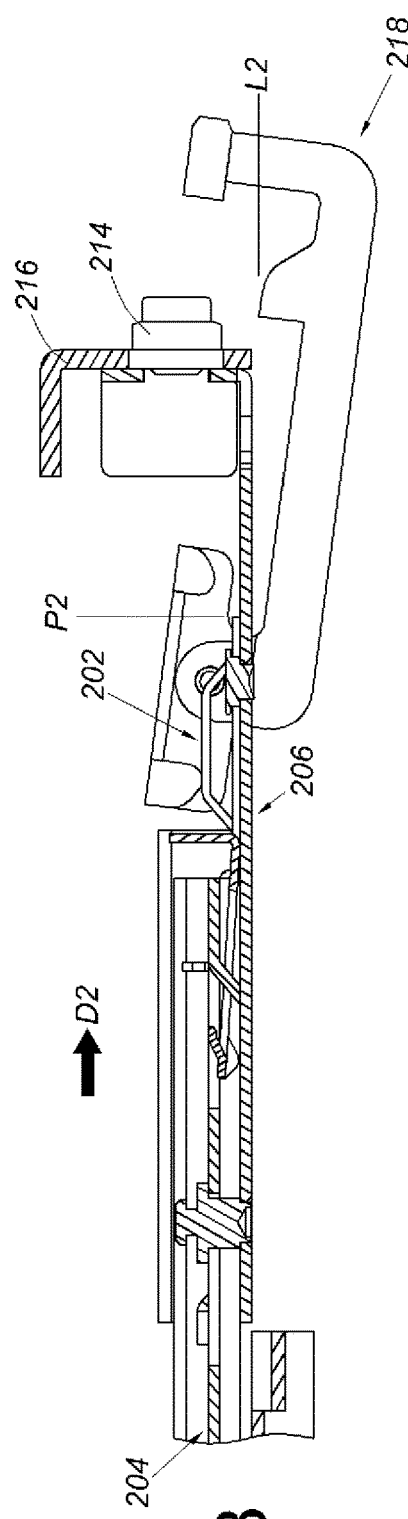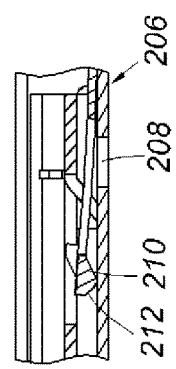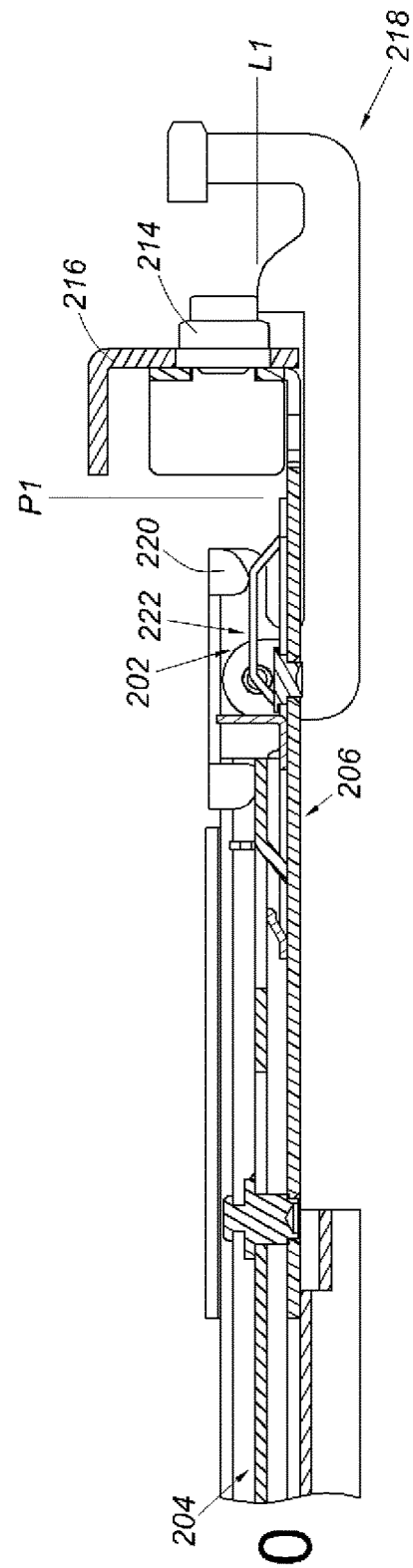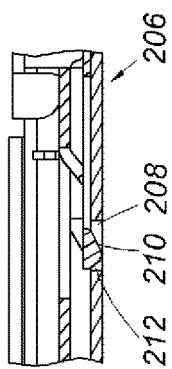

BRACKET DEVICE

CROSS REFERENCE TO RELATED APPLICATIONS

This application is a continuation application of U.S. application Ser. No. 14/955,055, filed on Dec. 1, 2015. This application claims the benefit of U.S. application Ser. No. 14/955,055, which was filed on Dec. 1, 2015, and is incorporated herein by reference.

BACKGROUND OF THE INVENTION

1. Field of the Invention

The present invention relates to a bracket device, and more particularly, to a bracket device capable of being easily detached from or mounted to a post of a rack.

2. Description of the Prior Art

China patent publication number CN102695396B discloses a slide rail tool free mounting frame for a server, which comprises a pair of frame positioning columns (4) arranged on a slide rail back mounting frame (1) and a frame floating hook (2). The frame floating hook (2) includes a pair of hooks (230) respectively arranged on a pair of wings (205), which are respectively provided with slide guide sleeves (201) and are in fixed connection through an ' arch door' shaped bending piece (206). The slide rail back mounting frame (1) is fixed with two slide guide columns (101), which are sleeved in the slide guide sleeves (201) and are in fixed connection through limit screws (7). First return springs (6) are arranged on the slide guide sleeves (201) between the wings (205) and the limit screws (7). The slide rail back mounting frame (1) is further provided with a floating pin hole (104) for placing a floating pin (3). One end of the floating pin (3) is connected to the 'arch door' shaped bending piece (206) through the limit screws (7), and the other end of the floating pin is a conical head (301) arranged in the floating pin hole (104). Second return springs (5) are arranged on the floating pin (3) between an end face of the conical head (301) and the limit screws (7).

According to such arrangement, although the prior art can lock or release the slide rail back mounting frame (1) through the floating pin (3) driven by an outer rail of the slide rail covered by a back frame. However, the design of the prior art is easily limited by length of the outer rail and adjustment amount of a bracket cooperating with the outer rail, such that there are restrictions on use. In other words, the length of the outer rail must be long enough for driving the floating pin (3) in order to lock or release the slide rail back mounting frame (1).

SUMMARY OF THE INVENTION

The present invention relates to a bracket device capable of being easily detached from or mounted to a post of a rack.

According to an embodiment of the present invention, a bracket device comprises a bracket, a hook, a locking element, and an extension element. The bracket has a first engagement part. The hook is connected to the bracket and located at a close position relative to the bracket. The locking element is operatively engaged with the first engagement part of the bracket for abutting against the hook to hold the hook at the close position. The extension element is connected to the locking element. Wherein, when the locking element is operatively disengaged from the bracket, the locking element no longer abuts against the hook, and the hook is no longer held at the close position relative to the bracket.

According to the above embodiment, the locking element has a supporting feature, a first inclined surface and a second inclined surface are respectively arranged two sides of the supporting feature respectively for abutting against the hook at different positions relative to the locking element.

According to the above embodiment, the slide rail further comprises an rail element and an extension element connected to the locking element, the rail element has a first part, the extension element has a second part facing toward the first part of the rail element, the extension element is configured to be driven by the rail element to move when the first part abuts against the second part.

According to the above embodiment, the slide rail further comprises an auxiliary elastic element arranged between the locking element and the extension element.

According to the above embodiment, the hook has a second leg with a contact surface, the supporting feature of the locking element has a contact surface corresponding to the contact surface of the second leg of the hook, one of contact surfaces of the supporting feature of the locking element and the contact surface of the second leg of the hook is an inclined surface, when the locking element is disengaged from the bracket, the inclined surface pushes the second leg of the hook to rotate the hook from the close position to an open position.

According to the above embodiment, the locking element has a second engagement part operatively engaged with the first engagement part.

According to the above embodiment, the locking element comprises an elastic arm connected to the second engagement part, and a disengagement feature connected to the elastic arm, the slide rail further comprises an extension element connected to the locking element, the extension element has a disengagement part for disengaging the second engagement part of the locking element from the first engagement part of the bracket of the bracket device.

According to the above embodiment, the locking element has a first guiding part, the slide rail further comprises a connection element passing through part of the first guiding part for connecting the locking element to the bracket of the bracket device.

According to the above embodiment, the first guiding part is an elongated hole.

According to the above embodiment, the extension element has a second guiding part, the slide rail further comprises a supporting element passing through part of the second guiding part for connecting the extension element to the bracket.

According to the above embodiment, the second guiding part is an elongated hole.

According to the above embodiment, the bracket comprises a side plate, the side plate has a first wall and a second wall defining a space, the extension element is movable in the space.

According to the above embodiment, the hook is pivoted to the bracket.

According to another embodiment of the present invention, a bracket device comprises a bracket, a hook, a locking element, and an extension element. The bracket has a first engagement part. The hook is connected to the bracket and located at a close position relative to the bracket. The locking element is operatively engaged with the first engagement part of the bracket for abutting against the hook to hold the hook at the close position. The extension element is connected to the locking element. Wherein, when the locking element is operatively disengaged from the bracket, the locking element no longer abuts against the hook, and the hook is no longer held at the close position relative to the bracket. Wherein, the slide rail further comprises an rail element and an extension element connected to the locking element, the rail element has a first part, the extension element has a second part facing toward the first part of the rail element, the extension element is configured to be driven by the rail element to move when the first part abuts against the second part.

According to another embodiment of the present invention, a bracket device comprises a bracket, a hook, a locking element, and an extension element. The bracket has a first engagement part. The hook is connected to the bracket and located at a close position relative to the bracket. The locking element is operatively engaged with the first engagement part of the bracket for abutting against the hook to hold the hook at the close position. The extension element is connected to the locking element. Wherein, when the locking element is operatively disengaged from the bracket, the locking element no longer abuts against the hook, and the hook is no longer held at the close position relative to the bracket. Wherein, the locking element has a second engagement part operatively engaged with the first engagement part. Wherein, the locking element comprises an elastic arm connected to the second engagement part, and a disengagement feature connected to the elastic arm, the slide rail further comprises an extension element connected to the locking element, the extension element has a disengagement part for disengaging the second engagement part of the locking element from the first engagement part of the bracket of the bracket device.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 5 is a diagram showing the bracket device being mounted to the second post according to an embodiment of the present invention.

FIG. 6 is a cross-sectional view along line 6-6 in FIG. 5.

FIG. 7 is a cross-sectional view along line 7-7 in FIG. 5.

FIG. 10 is a diagram showing the bracket device being moved relative to the second post along a first direction according to an embodiment of the present invention.

FIG. 11 is a cross-sectional view along line 11-11 in FIG. 10.

FIG. 12 is a diagram showing the bracket device continuing to move relative to the second post along the first direction according to an embodiment of the present invention.

FIG. 13 is a cross-sectional view along line 13-13 in FIG. 12.

FIG. 14 is a diagram showing the bracket device continuing to move relative to the second post along the first direction and a disengagement part of the extension element abutting against a disengagement feature of a locking element for disengagement according to an embodiment of the present invention.

FIG. 15 is a cross-sectional view along line 15-15 in FIG. 14.

FIG. 16 is a cross-sectional view along line 16-16 in FIG. 14.

FIG. 17 is a diagram showing the locking element of the bracket device moving along the first direction in response to an elastic force of an auxiliary elastic element according to an embodiment of the present invention.

FIG. 18 is a cross-sectional view along line 18-18 in FIG. 17.

FIG. 19 is a diagram showing the locking element moving to drive a hook according to an embodiment of the present invention.

FIG. 20 is a cross-sectional view along line 20-20 in FIG. 19.

FIG. 23 is a diagram showing the bracket device being mounted to the second post along the second direction according to an embodiment of the present invention.

FIG. 24 is a partial cross-sectional view of FIG. 23 in another view angle for illustrating a first engagement part of a second bracket and a second engagement part of the locking element not being engaged with each other.

FIG. 25 is a diagram showing the bracket device being mounted to the second post according to an embodiment of the present invention.

FIG. 26 is a partial cross-sectional view of FIG. 25 in another viewing angle for illustrating the second engagement part of the locking element and the first engagement part of the second bracket being engaged with each other.

FIG. 28 is a diagram showing the bracket device being mounted to the second post along the second direction according to another embodiment of the present invention.

FIG. 29 is a partial cross-sectional view of FIG. 28 in another viewing angle for illustrating a first engagement part of a second bracket and a second engagement part of a locking element not being engaged with each other.

FIG. 30 is a diagram showing the bracket device being mounted to the second post according to another embodiment of the present invention.

FIG. 31 is a partial cross-sectional view of FIG. 30 in another viewing angle for illustrating the second engagement part of the locking element and the first engagement part of the second bracket being engaged with each other.

DETAILED DESCRIPTION

Figure 1:
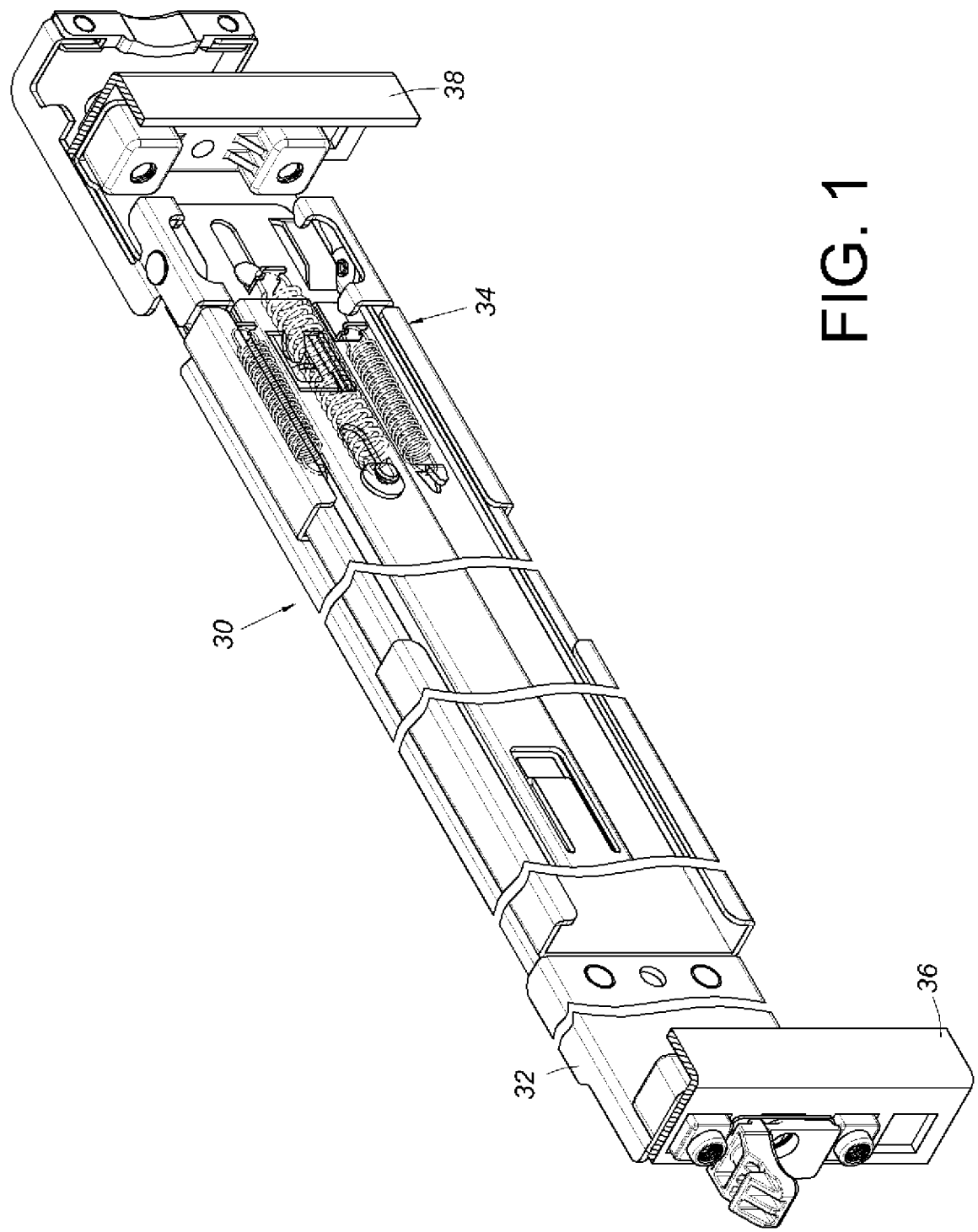
FIG. 1 is a diagram showing a slide rail assembly being mounted to a first post and a second post according to an embodiment of the present invention.

FIG. 1 is a diagram showing a slide rail assembly 30 mounted to a first post 36 and a second post 38 by a first bracket 32 and a bracket device 34 according to an embodiment of the present invention.

Figure 2:
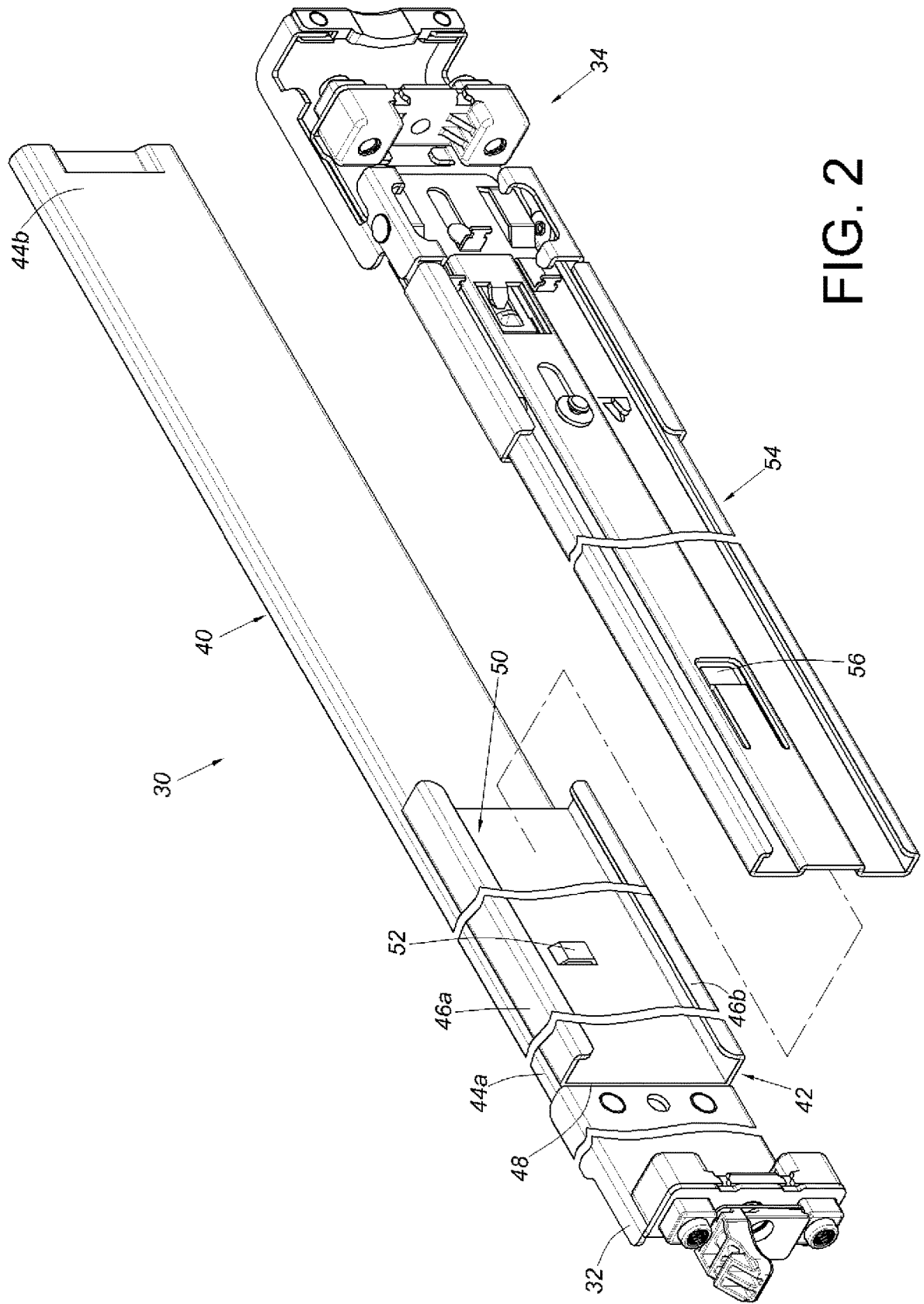
FIG. 2 is an exploded view of the slide rail assembly according to an embodiment of the present invention.
Figure 3:
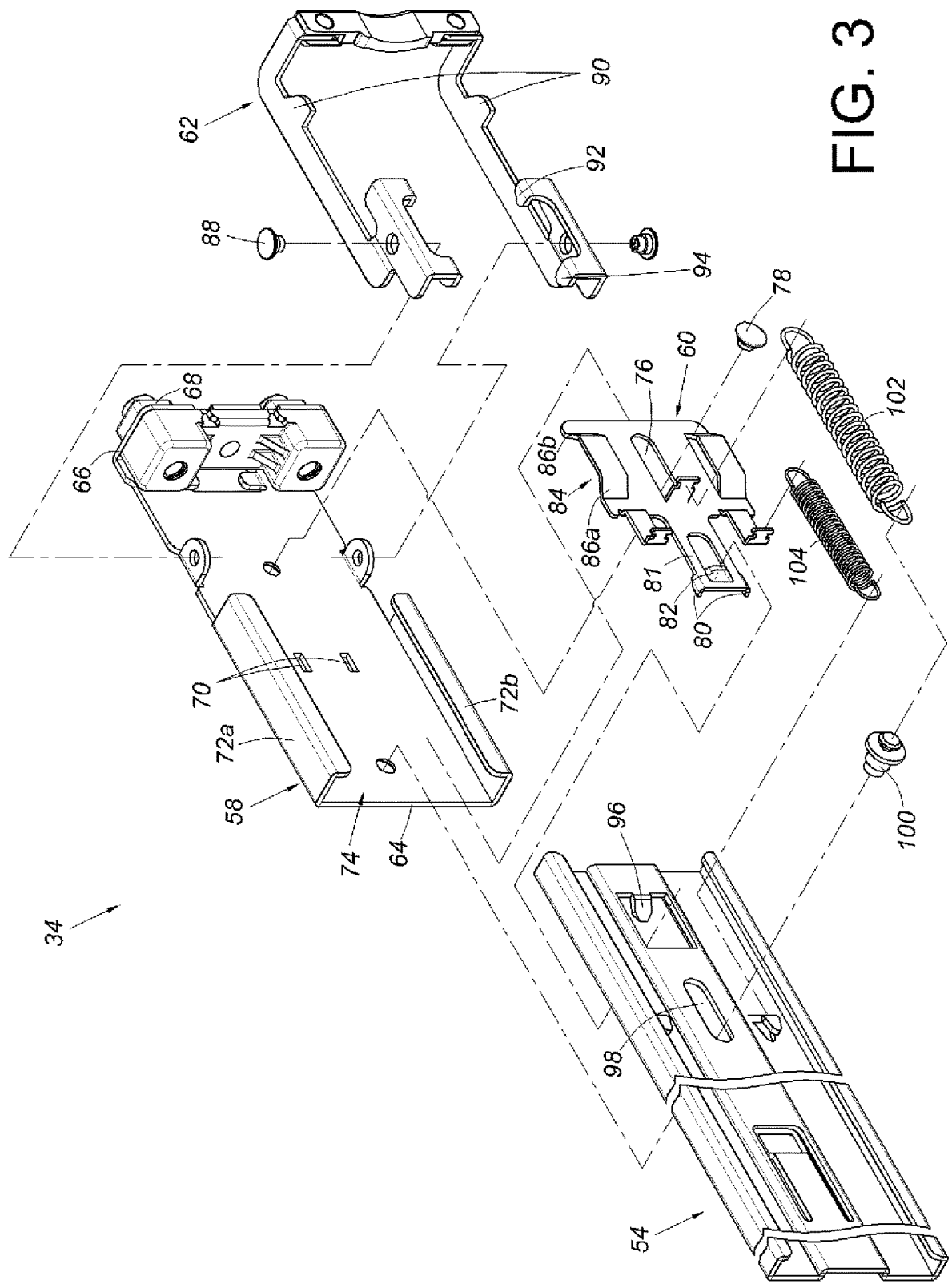
FIG. 3 is an exploded view of a bracket device according to an embodiment of the present invention.

As shown in FIG. 2, the slide rail assembly 30 comprises a rail element 40 and a supporting frame 42. The rail element 40 has a first end 44a and a second end 44b opposite to the first end 44a. The supporting frame 42 is fixed to the rail element 40 as a part of the rail element 40. The supporting frame 42 has an upper wall 46a, a lower wall 46b, and a longitudinal wall 48 connected between the upper wall 46a and the lower wall 46b. A passage 50 is defined by the upper wall 46a, the lower wall 46b and the longitudinal wall 48. The longitudinal wall 48 has a first part 52 (such as a bump). The first bracket 32 is connected to the rail element 40 to be adjacent to the first end 44a. The slide rail assembly 30 further comprises an extension element 54 connected to the bracket device 34. The extension element 54 is movably connected to the supporting frame 42 of the rail element 40 and capable of moving along the passage 50 of the supporting frame 42. The extension element 54 has a second part 56 correspondingly faces toward the first part 52 of the supporting frame 42. The bracket device 34 is located adjacent to the second end 44b of the rail element 40.

As shown in FIG. 3 to FIG. 7, the bracket device 34 comprises a second bracket 58, a locking element 60, and a hook 62. The second bracket 58 comprises a side plate 64, an end plate 66 substantially perpendicularly connected to the side plate 64, and at least one mounting element 68 mounted to the end plate 66. The side plate 64 has at least one first engagement part 70, a first wall 72a, and a second wall 72b. A space 74 is defined by the first wall 72a and the second wall 72b. The locking element 60 is operatively engaged with the second bracket 58. The locking element 60 has a first guiding part 76, such as an elongated hole, and a connection element 78 passing through part of the first guiding part 76 for connecting the locking element 60 to the side plate 64 of the second bracket 58, in order to allow the locking element 60 to move relative to the second bracket 58 within a guiding area defined by the first guiding part 76. The locking element 60 comprises at least one second engagement part 80, an elastic arm 81 connected to the at least one second engagement part 80, a disengagement feature 82 connected to the elastic arm 81, and at least one supporting feature 84. The hook 62 is connected to the second bracket 58. For example, the hook 62 is movably connected to the second bracket 58 by a pivoting element 88. The hook 62 has at least one blocking part 90, a first leg 92 and a second leg 94. Preferably, one of contact surfaces between the supporting feature 84 of the locking element 60 and the second leg 94 of the hook 62 is a first inclined surface 86a; and one of contact surfaces between the supporting feature 84 of the locking element 60 and the first leg 92 of the hook 62 is a second inclined surface 86b. In the present embodiment, the first inclined surface 86a and the second inclined surface 86b are respectively arranged at two sides of the supporting feature 84 for example.

Figure 4:
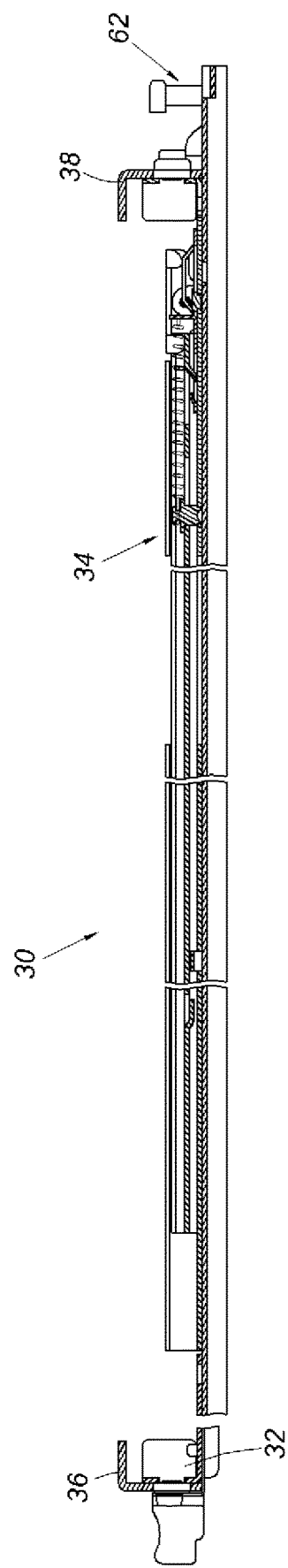
FIG. 4 is a diagram showing the slide rail assembly being mounted to the first post and the second post according to an embodiment of the present invention.

FIG. 4 is a diagram showing the slide rail assembly 30 mounted between the first post 36 and the second post 38 by the first bracket 32 and the bracket device 34.

The extension element 54 is connected to the second bracket 58 and is movable in the space 74. The extension element 54 has a disengagement part 96 and a second guiding part 98. The disengagement part 96 correspondingly faces toward the disengagement feature 82 of the locking element 60. Preferably, one of the disengagement part 96 and the disengagement feature 82 has an inclined section. In the present embodiment, the disengagement part 96 has the inclined section for example. The second guiding part 98 can be an elongated hole, and a supporting element 100 passes through part of the second guiding part 98 for connecting the extension element 54 to the side plate 64 of the second bracket 58, in order to allow the extension element 54 to move relative to the second bracket 58 within a guiding area defined by the second guiding part 98. Preferably, the slide rail assembly 30 further comprises an elastic element 102 and at least one auxiliary elastic element 104. The elastic element 102 is arranged between the locking element 60 and the supporting element 100. The auxiliary elastic element 104 is arranged between the locking element 60 and the extension element 54.

FIG. 6 and FIG. 7 are diagrams further show that the bracket device 34 is mounted to a hole 106 of the second post 38 by the at least one mounting element 68. The supporting feature 84 of the locking element 60 is configured to abut against the first leg 92 of the hook 62, in order to hold the hook 62 at a close position L1 relative to the second post 38 or the second bracket 58, where the blocking part 90 of the hook 62 corresponds to (or face toward) the second post 38. On the other hand, when the hook 62 is at the close position L1, the second engagement part 80 of the locking element 60 and the first engagement part 70 of the second bracket 58 are mutually engaged. Meanwhile, the locking element 60 is located at a first position P1 relative to the second bracket 58.

Figure 8:
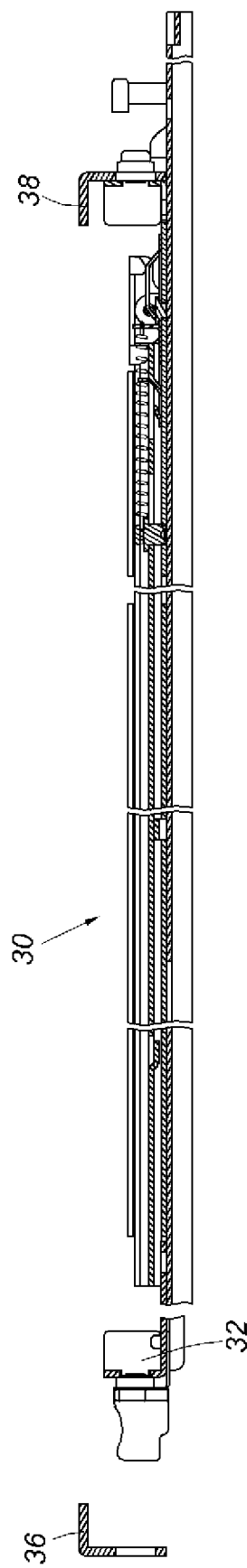
FIG. 8 is a diagram showing a first bracket being detached from the first post.

As shown in FIG. 8, when the slide rail assembly 30 is going to be detached from the first post 36 and the second post 38, a user can stand at a position in front of the first post 36 to dismount the first bracket 32 from the first post 36 (mounting manner is not shown in the figure) in order to separate the first bracket 32 from the first post 36.

Figure 9:
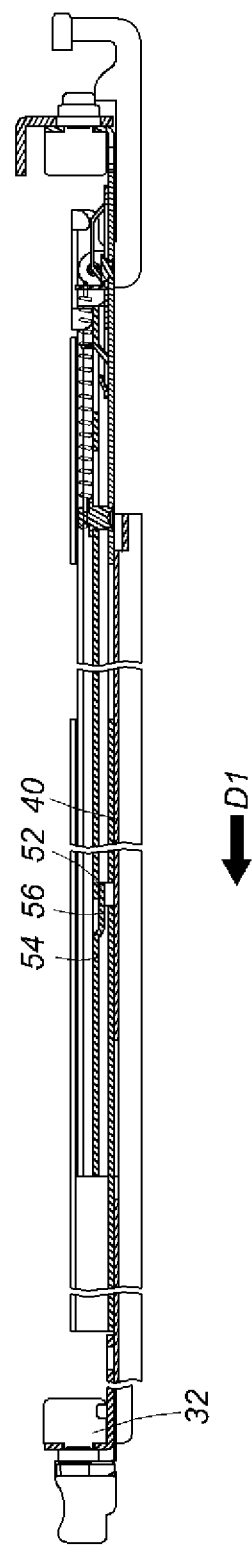
FIG. 9 is a diagram showing a first part of a rail element abutting against a second part of an extension element.

As shown in FIG. 9, after the first bracket 32 is separated from the first post 36, a force can be applied to move the rail element 40 along a first direction D1 until the first part 52 of the rail element 40 abuts against the second part 56 of the extension element 54. Therefore, the extension element 54 can be operatively moved along the first direction D1.

As shown in FIG. 10 and FIG. 11, the locking element 60 of the bracket device 34 can be operatively moved along the first direction D1 by the extension element 54, in order to drive the second bracket 58 to move, such that the blocking part 90 of the hook 62 abuts against the second post 38.

As shown in FIG. 12 and FIG. 13, the extension element 54 can be further operatively moved along the first direction D1, in order to allow the disengagement part 96 of the extension element 54 to abut against the disengagement feature 82 of the locking element 60. Meanwhile, the at least one auxiliary elastic element 104 is stretched due to the movement of the extension element 54 to generate an elastic force.

As shown in FIG. 14 to FIG. 16, when the disengagement part 96 of the extension element 54 abuts against the disengagement feature 82 of the locking element 60, and the extension element 54 continues to move along the first direction D1, the disengagement feature 82 of the locking element 60 is lifted up by the disengagement part 96 of the extension element 54, such that the second engagement part 80 of the locking element 60 is disengaged from the first engagement part 70 of the second bracket 58.

As shown in FIG. 17 and FIG. 18, when the second engagement part 80 of the locking element 60 is disengaged from the first engagement part 70 of the second bracket 58, the locking element 60 is moved relative to the second bracket 58 along the first direction D1 from the first position P1 in response to the elastic force of the elastic element 102 and/or the auxiliary elastic element 104, such that the supporting feature 84 of the locking element 60 no longer abuts against the first leg 92 of the hook 62.

As shown in FIG. 19 and FIG. 20, while the locking element 60 is moved along the first direction D1 to a second position P2 by the extension element 54, since one of the contact surfaces between the supporting feature 84 of the locking element 60 and the second leg 94 of the hook 62 is the first inclined surface 86a, the locking element 60 pushes the second leg 94 of the hook 62 with assistant of the first inclined surface 86a, in order to rotate the hook 62 an angle to move from the close position L1 to an open position L2 relative to the second post 38 or the second bracket 58. When the locking element 60 is located at the second position P2, the supporting feature 84 of the locking element 60 abuts against the second leg 94 of the hook 62, in order to hold the hook 62 at the open position L2. In such state, the blocking part 90 of the hook 62 no longer corresponds to the second post 38.

Figure 21:
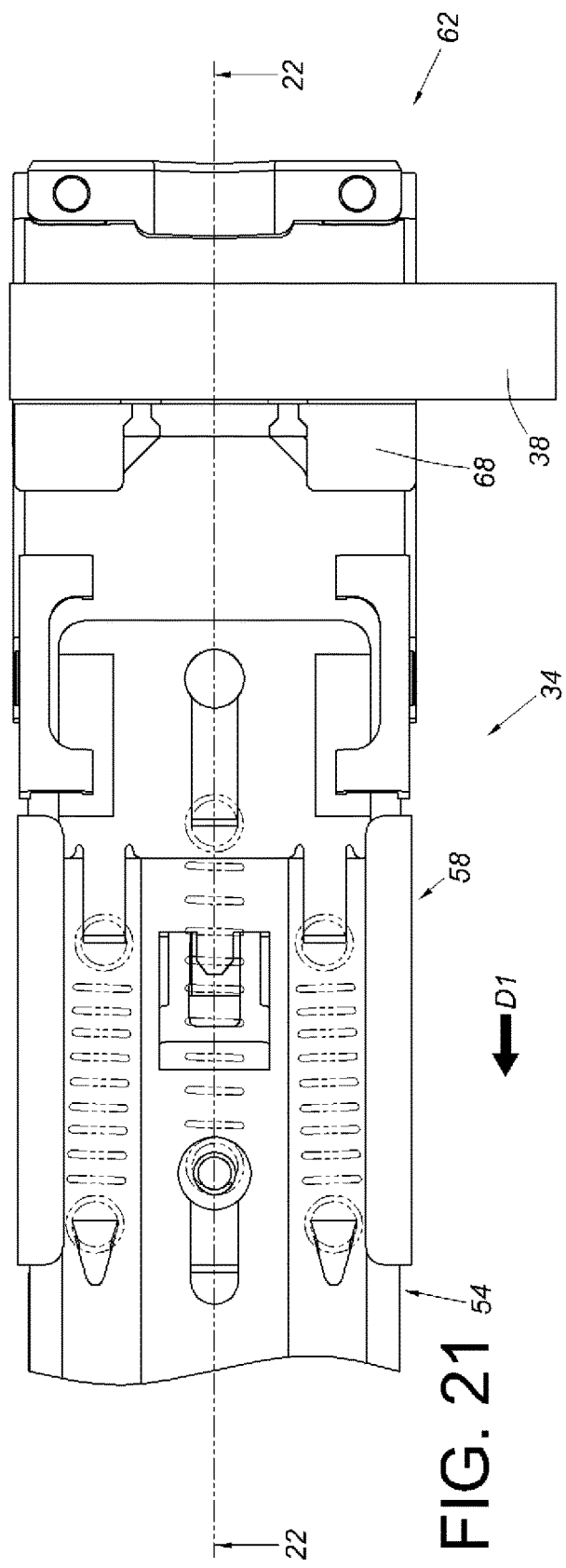
FIG. 21 is a diagram showing the bracket device being detached from the second post according to an embodiment of the present invention.
Figure 22:
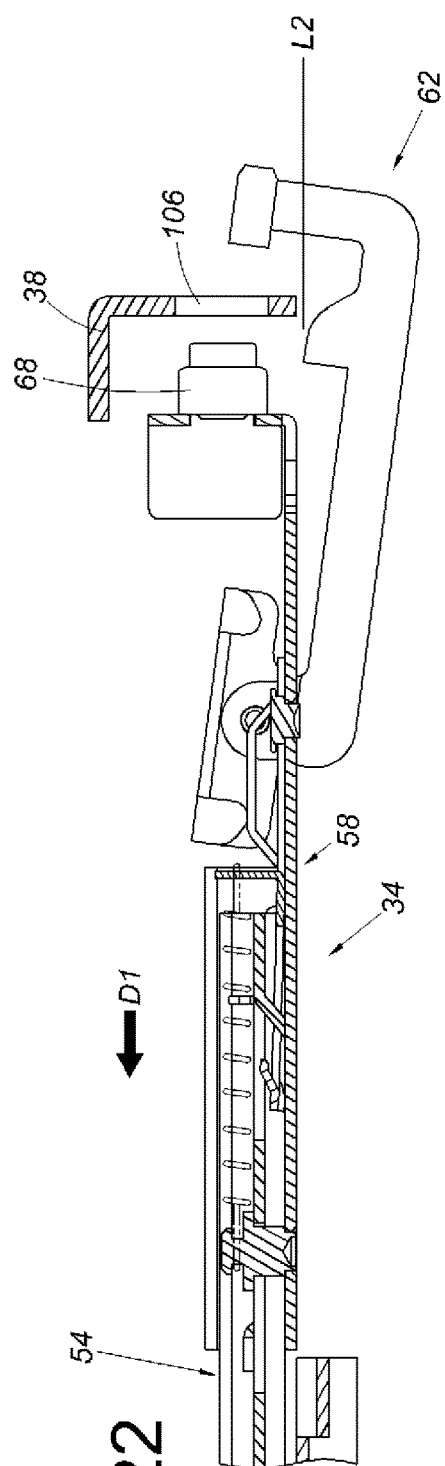
FIG. 22 is a cross-sectional view along line 22-22 in FIG. 21.

As shown in FIG. 21 and FIG. 22, when the hook 62 is located at the open position L2 and the extension element 54 is continuously moved along the first direction D1, the mounting element 68 of the second bracket 58 of the bracket device 34 can be separated from the hole 106 of the second post 38, in order to detach the bracket device 34 from the second post 38.

As shown in FIG. 23 and the FIG. 24, when the bracket device 34 is going to be mounted to the second post 38, the user can set the hook 62 in an open state, and then move the bracket device 34 toward the second post 38 along a second direction D2, such that the second bracket 58 is mounted to the hole 106 of the second post 38 by the at least one mounting element 68 with the second bracket 58 abutting against the second post 38.

As shown in FIG. 25 and the FIG. 26, when the second bracket 58 abuts against the second post 38, the user can apply a force to the locking element 60 along the second direction D2, in order to move the locking element 60 relative to the second bracket 58 from the second position P2 to the first position P1. During such process, since one of the contact surfaces between the supporting feature 84 of the locking element 60 and the first leg 92 of the hook 62 is the second inclined surface, the locking element 60 pushes the first leg 92 of the hook 62 with assistant of the second inclined surface 86b, in order to move the hook 62 relative to the second post 38 or the second bracket 58 from the open position L2 to the close position L1. When the hook 62 is located at the close position L1, the second engagement part 80 of the locking element 60 and the first engagement part 70 of the second bracket 58 are mutually engaged, and the supporting feature 84 of the locking element 60 abuts against the first leg 92 of the hook 62, in order to hold the hook 62 at the close position L1 relative to the second post 38 or the second bracket 58.

Figure 27:
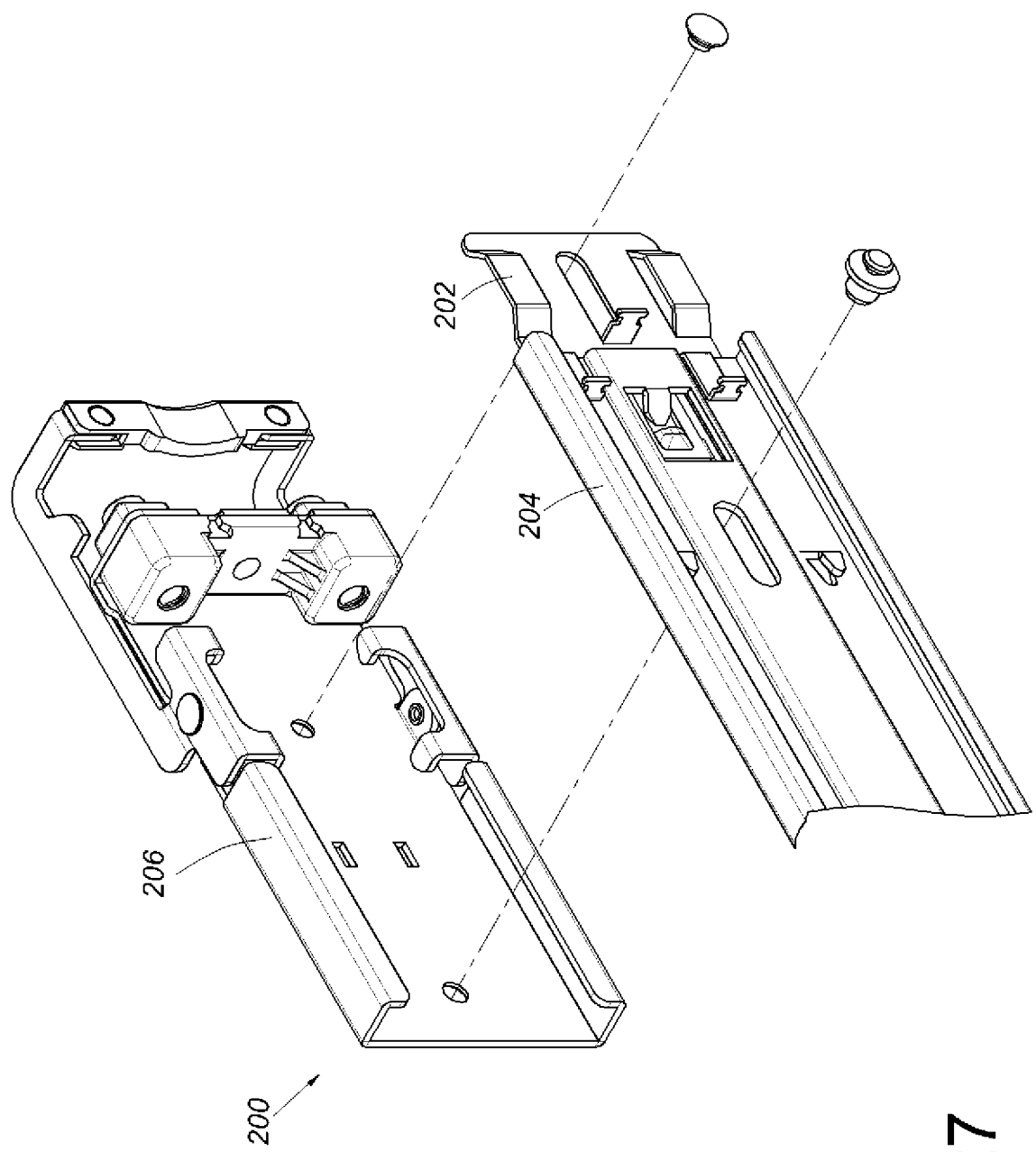
FIG. 27 is an exploded view of a bracket device according to another embodiment of the present invention.

FIG. 27 is a diagram showing a bracket device 200 according to another embodiment of the present invention. A locking element 202 is connected to an extension element 204. Therefore, the locking element 202 and the extension element 204 are integrated as a single component to be mounted to a bracket 206.

As shown in FIG. 28 and FIG. 29, in another embodiment of the present invention, one of contact surfaces between a first engagement part 208 of the bracket 206 and a second engagement part 210 of the locking element 202 is a guiding surface 212, such as an inclined surface or a curved surface. In the present embodiment, the guiding surface 212 of the second engagement part 210 of the locking element 202 is an inclined surface for example. During mounting, the locking element 202 is located at a second position P2 relative to the bracket 206, a mounting element 214 of the bracket 206 is mounted to a post 216 along a second direction D2, and a hook 218 is located at an open position L2 relative to the post 216 or the bracket 206.

As shown in FIG. 30 and FIG. 31, the locking element 202 is operatively moved to a first position P1, such that the first engagement part 208 of the bracket 206 and the second engagement part 210 of the locking element 202 are mutually engaged. The first leg 220 of the hook 218 abuts against the supporting feature 222 of the locking element 202 for holding the hook 218 at a close position L1 relative to the post 216 or the bracket 206.

In particular, operations for dismounting the bracket device 200 from the post 216 are same as the previous embodiment. The user only needs to move the locking element 202 along a direction opposite to the second direction D2, such that the second engagement part 210 of the locking element 202 can be disengaged from the first engagement part 208 of the bracket 206 through guiding of the guiding surface 212. Subsequent operations are same as those in the previous embodiment. Thus no further illustration is provided.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A bracket device configured to mount a slide rail assembly to a post, the bracket device comprising:
   a bracket having a first engagement part;
   a hook connected to the bracket of the bracket device and located at a close position relative to the bracket of the bracket device; and
   a locking element operatively engaged with the first engagement part of the bracket of the bracket device for abutting against the hook to hold the hook at the close position;
   wherein the slide rail assembly comprises an extension element connected to the locking element;
   wherein the locking element has a first guiding part, the slide rail assembly further comprises a connection element passing through part of the first guiding part for connecting the locking element to the bracket of the bracket device;
   wherein when the locking element is operatively disengaged from the bracket of the bracket device, a supporting feature of the locking element no longer abuts against a first leg of the hook, and the hook is no longer held at the close position relative to the bracket of the bracket device.

2. The bracket device of claim 1, wherein a first inclined surface and a second inclined surface are respectively arranged two sides of the supporting feature respectively for abutting against the hook at different positions relative to the locking element.

3. The bracket device of claim 1, wherein the slide rail assembly further comprises an rail element, the rail element has a first part, the extension element has a second part facing toward the first part of the rail element, the extension element is configured to be driven by the rail element to move when the first part abuts against the second part.

4. The bracket device of claim 3, wherein the slide rail assembly further comprises an auxiliary elastic element arranged between the locking element and the extension element.

5. The bracket device of claim 2, wherein the hook has a second leg with a contact surface, the supporting feature of the locking element has a contact surface corresponding to the contact surface of the second leg of the hook, one of contact surfaces of the supporting feature of the locking element and the contact surface of the second leg of the hook is an inclined surface, when the locking element is disengaged from the bracket of the bracket device, the inclined surface pushes the second leg of the hook to rotate the hook from the close position to an open position.

6. The bracket device of claim 1, wherein the locking element has a second engagement part operatively engaged with the first engagement part.

7. The bracket device of claim 6, wherein the locking element comprises an elastic arm connected to the second engagement part, and a disengagement feature connected to the elastic arm, the extension element has a disengagement part for disengaging the second engagement part of the locking element from the first engagement part of the bracket of the bracket device.

8. The bracket device of claim 1, wherein the first guiding part is an elongated hole.

9. The bracket device of claim 3, wherein the extension element has a second guiding part, the slide rail assembly further comprises a supporting element passing through part of the second guiding part for connecting the extension element to the bracket of the bracket device.

10. The bracket device of claim 9, wherein the second guiding part is an elongated hole.

11. The bracket device of claim 3, wherein the bracket of the bracket device comprises a side plate, the side plate has a first wall and a second wall defining a space, the extension element is movable in the space.

12. The bracket device of claim 1, wherein the hook is pivoted to the bracket of the bracket device.

13. A bracket device configured to mount a slide rail assembly to a post, the bracket device comprising:
  a bracket having a first engagement part;
  a hook connected to the bracket of the bracket device and located at a close position relative to the bracket of the bracket device; and
  a locking element operatively engaged with the first engagement part of the bracket of the bracket device for abutting against the hook to hold the hook at the close position;
  wherein the slide rail assembly comprises an extension element connected to the locking element;
  wherein when the locking element is operatively disengaged from the bracket of the bracket device, a supporting feature of the locking element no longer abuts against a first leg of the hook, and the hook is no longer held at the close position relative to the bracket of the bracket device;
  wherein the slide rail assembly further comprises an rail element, the rail element has a first part, the extension element has a second part facing toward the first part of the rail element, the extension element is configured to be driven by the rail element to move when the first part abuts against the second part.

14. A bracket device configured to mount a slide rail assembly to a post, the bracket device comprising:
  a bracket having a first engagement part;
  a hook connected to the bracket of the bracket device and located at a close position relative to the bracket of the bracket device; and
  a locking element operatively engaged with the first engagement part of the bracket of the bracket device for abutting against the hook to hold the hook at the close position;
  wherein the slide rail assembly comprises an extension element connected to the locking element;
  wherein when the locking element is operatively disengaged from the bracket of the bracket device, a supporting feature of the locking element no longer abuts against a first leg of the hook, and the hook is no longer held at the close position relative to the bracket of the bracket device;
  wherein the locking element has a second engagement part operatively engaged with the first engagement part;
  wherein the locking element comprises an elastic arm connected to the second engagement part, and a disengagement feature connected to the elastic arm, the extension element has a disengagement part for disengaging the second engagement part of the locking element from the first engagement part of the bracket of the bracket device.

* * * * *